United States Patent
Ueda

(10) Patent No.: US 9,407,986 B2
(45) Date of Patent: Aug. 2, 2016

(54) SIMULTANEOUS WIRED AND WIRELESS CONNECTION FOR DEMONSTRATION PRODUCT

(71) Applicant: Bose Corporation, Framingham, MA (US)

(72) Inventor: Joji Ueda, Cambridge, MA (US)

(73) Assignee: Bose Corporation, Framingham, MA (US)

( * ) Notice: Subject to any disclaimer, the term of this patent is extended or adjusted under 35 U.S.C. 154(b) by 32 days.

(21) Appl. No.: 14/339,585

(22) Filed: Jul. 24, 2014

(65) Prior Publication Data

US 2016/0029118 A1    Jan. 28, 2016

(51) Int. Cl.
*H03G 3/00*      (2006.01)
*H04R 3/00*      (2006.01)
*H03G 1/02*      (2006.01)
*G06F 3/16*      (2006.01)
*G08B 13/22*     (2006.01)

(52) U.S. Cl.
CPC ........ *H04R 3/00* (2013.01); *G06F 3/162* (2013.01); *G08B 13/22* (2013.01); *H03G 1/02* (2013.01); *H04R 2420/01* (2013.01); *H04R 2420/07* (2013.01); *H04R 2430/01* (2013.01)

(58) Field of Classification Search
CPC ............ H03F 3/04; H03F 1/02; H03F 3/001; H03F 1/0088; H03F 3/02; G06F 3/162
See application file for complete search history.

(56) References Cited

U.S. PATENT DOCUMENTS

| | | | | |
|---|---|---|---|---|
| 2003/0121401 | A1* | 7/2003 | Ito | G10H 1/0083 84/625 |
| 2005/0263315 | A1* | 12/2005 | Marszalek | E05B 45/005 174/108 |
| 2007/0087710 | A1* | 4/2007 | Chou | H03D 7/1441 455/127.4 |
| 2007/0286431 | A1* | 12/2007 | Chou | H04R 3/04 381/74 |
| 2008/0156922 | A1* | 7/2008 | Rabinowitz | B65H 75/368 242/372 |
| 2009/0109054 | A1* | 4/2009 | Ueda | H04M 1/04 340/13.24 |
| 2011/0059696 | A1* | 3/2011 | Rasmussen | H04R 25/552 455/41.1 |

* cited by examiner

*Primary Examiner* — Simon Sing

(57) ABSTRACT

A demonstration system includes a demonstration processor including a wired audio output, a data interface, and an anchor point. A portable audio device includes a wireless interface for receiving first audio signals, a wired audio input for receiving second audio signals, a mixing circuit outputting third audio signals including audio content from both the first and second audio signals, an output audio transducer for receiving the third audio signals from the mixing circuit and outputting them as audible signals, a user interface, a data interface, and a programmable processor in communication with the user interface and the data interface. A cable bundle includes a security cable for connection between the anchor point and the portable audio device thereby preventing theft of the portable audio device, and electrical conductors connecting the wired audio output of the demonstration processor to the wired audio input of the portable audio device.

21 Claims, 5 Drawing Sheets

SIMULTANEOUS WIRED AND WIRELESS CONNECTION FOR DEMONSTRATION PRODUCT

BACKGROUND

The present invention relates to providing simultaneous wired and wireless connections to a demonstration model of a wireless product.

In general, Bluetooth® wireless technology is a wireless communications system intended to replace the cables connecting electronic devices. Devices may be connected for various purposes, including remote control, exchange of data, or playback of audio signals generated by one device on a speaker in another device. In the context of this application, when we refer to "Bluetooth" we are referring to protocols and connections operating according to the version of the Bluetooth specification released by the Bluetooth Special Interest Group (Bluetooth SIG) as of the filing date of this application, which is Version 4.0 [Vol 0], 30 Jun. 2010. Other wireless technologies may provide similar features and capabilities and may be used in the same manner.

SUMMARY

In general, in one aspect, a portable audio device includes a wireless interface for receiving first audio signals, a wired audio input for receiving second audio signals, a mixing circuit coupled to the wireless interface and the wired audio input and outputting third audio signals including audio content from both the first and second audio signals, an output audio transducer for receiving the third audio signals from the mixing circuit and outputting them as audible signals, and a security cable for discouraging theft of the portable audio device, wherein the security cable includes first electrical conductors providing the wired connection for receiving the second audio signals.

Implementations may include one or more of the following, in any combination. The device may be a set of headphones. The device may be a portable speaker. The device includes a user interface, a data interface, and a programmable processor in communication with the user interface and the data interface. The security cable may include second electrical conductors providing the data interface to the programmable processor. The programmable processor may be responsive to remote control commands received through the data interface, and may communicate information about the status of the user interface through the data interface. The security cable may include a metal component soldered to a printed circuit board within the portable audio device, such that the security cable discourages theft of the portable audio device by assuring that removing the security cable from the portable audio device will damage the printed circuit board. The metal component in the security cable may include one or more conductors of an audio cable or a data cable. The security cable may include an audio cable and a data cable. The audio cable and the data cable may be each independently jacketed, the two jackets being joined together. The mixing circuit may include an audio amplifier having two differential signal inputs, with the wireless interface including two differential signal outputs, coupled to the differential signal inputs of the amplifier, and the wired audio input including two single-ended signal outputs, each of the two single-ended signal outputs being coupled to one side of a corresponding one of the two differential inputs of the amplifier.

In general, in one aspect, a demonstration system includes a demonstration processor including a wired audio output, a data interface, and an anchor point. A portable audio device includes a wireless interface for receiving first audio signals, a wired audio input for receiving second audio signals, a mixing circuit coupled to the wireless interface and the wired audio input and outputting third audio signals including audio content from both the first and second audio signals, an output audio transducer for receiving the third audio signals from the mixing circuit and outputting them as audible signals, a user interface, a data interface, and a programmable processor in communication with the user interface and the data interface. A cable bundle includes a security cable for connection between the anchor point and the portable audio device thereby preventing theft of the portable audio device, and electrical conductors connecting the wired audio output of the demonstration processor to the wired audio input of the portable audio device.

Implementations may include one or more of the following, in any combination. The processor may be configured to communicate information about the operation of the user interface to the demonstration processor via the data interface. The cable bundle may include data conductors connecting the data interface of the demonstration processor to the data interface of the portable audio device. The anchor point may include an audio jack mating with a corresponding plug on the security cable. The anchor point may include a clip securing the cable to a fixed surface. The security cable may include a metal component soldered to a printed circuit board within the portable audio device, such that the security cable discourages theft of the portable audio device by assuring that removing the security cable from the portable audio device will damage the printed circuit board. The portable audio device user interface may includes a volume control interface, the programmable processor of the portable audio device being configured to communicate information relating to operation of the volume control interface to the demonstration processor over the data interface. The programmable processor of the portable audio device may be responsive to remote control commands from the demonstration processor received through the data interface, and may communicate information about the status of the user interface to the demonstration processor through the data interface.

In general, in one aspect, demonstrating a portable audio device includes connecting a wired audio input of the portable audio device to an audio output of a demonstration device using an audio conductor integrated into a security cable. In the demonstration device, first audio signals that prompt a user to take action to connect a wireless audio source device to a wireless audio interface of the portable audio device are provided through the audio output to the portable audio device. In the portable audio device the first audio signals are output as audible signals; upon receiving second audio signals over the wireless audio interface, the second audio signals are mixed with the first audio signals received at the wired audio input, fourth audio signals including audio content from both the first and second audio signals are output as audible signals, and information is communicated to the demonstration device over a data interface that the customer has connected the wireless audio source device.

Implementations may include one or more of the following, in any combination. Communicating over the data interface may include communicating through a wired data cable integrated into the security cable. Remote control commands may be communicated from the demonstration system to the portable audio device thorough the data interface. Volume control commands may be received through the user interface of the portable audio device, and communicated to the demonstration system through the data interface, the volume of the first audio signals provided from the demonstration system to the portable audio device then being adjusted.

Advantages include allowing an interactive demonstration in which the customer can use their own source device to confirm compatibility with and enjoyment of the demonstrated product, while allowing the operator of the demonstration to maintain control of the product and to provide audio prompts through the product.

DETAILED DESCRIPTION

Figure 1:
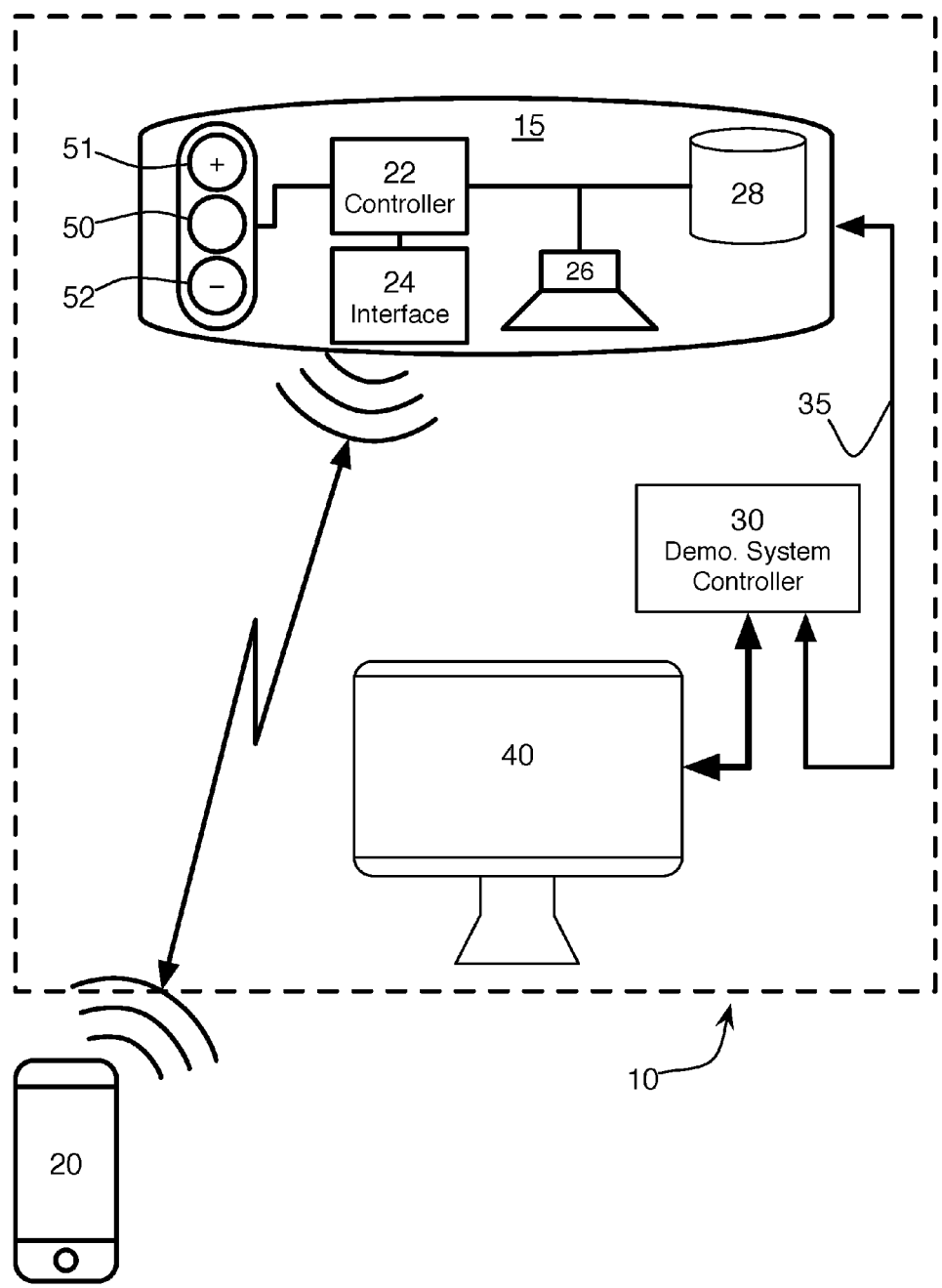
FIG. 1 is a block diagram of an exemplary wireless product demonstration system.

In the retail environment, it is desirable for consumers to be able to try out audio products, as the specific audible performance of a product is a very personal preference. In many retail environments, it is not possible or practical for sales staff to supervise every demonstration to assure an optimum demonstration or prevent theft of the product. For conventional audio systems, that can be anchored to a wall or table, security is not a problem. Similarly, for wired headphones, where the cable can be reinforced to prevent theft, securing demonstration models is not difficult. In both cases, however, assuring demonstration quality remains an issue. For the increasingly popular category of wireless audio products, and in particular wireless headphones, however, securing the product is difficult, and demonstration quality can be even more complex. It has generally been found, however, that customers understand the need to secure products against theft, and will tolerate a security cable tethering a wireless product, as long as it is not so tight as to prevent them from, e.g., trying on wireless headphones, or experiencing how much a portable speaker weighs.

Another complication with demonstrating personal audio products such as wireless headphones and portable wireless speakers is that many customers want to be able to listen to their own music for the demonstration. Given the complexity of such products, manufacturers and retailers might want to provide their own audio that explains the product and walks the customer through the demonstration. Providing an interactive demonstration is difficult if the customer is providing the audio from their own source rather than using the audio from a demonstration system. Customers may also want to connect their own devices to confirm that they are compatible with the product in question and that the customer is comfortable with the user interface of the product. Even if the normal customer-facing user interface of the product is so easy to use that no interactive demonstration is needed, the product may need to be reset and put into a particular mode between each demonstration. Normal wireless interfaces do not necessarily provide the amount of control over the wireless product that an interactive demonstration may require.

A solution to the problem of providing demonstration audio while also allowing customers to provide their own audio is to provide a wired audio connection in parallel to the wireless connection. Since the security cable is going to be present anyway, and for a battery-powered product, a power cable is also likely to be needed, adding an audio cable does not detract much further from the demonstration of the wireless product. Many wireless products, in fact, appear to already have this capability, as they include a wired audio input for use when the batteries die or when wireless radio use is not permitted or available. The problem, however, is that the wired audio inputs on such products generally override the wireless input, in some cases turning it off completely when an audio cord is connected. At best, the wired and wireless inputs are treated as separate inputs which the user must choose between, and no remote control over the wireless interface is provided through the wired interface. The demonstration product described herein solves this problem by adding an additional wired audio input, separate from any provided for normal consumer use, which is mixed with the wirelessly-received audio signal. The mixed signal is then amplified and provided to the speakers, so that the customer can hear both the demonstration audio delivered through the wired connection and whatever wireless audio the customer chooses to listen to. Additionally, the wired connection allows the transferring of state information and control commands that are not available over the wireless connection, allowing the demonstration system to know and control the state of the product.

As shown in FIG. 1, an exemplary wireless product demonstration system 10 includes wireless audio device 15, a demonstration system controller 30, and a demonstration display 40. A wired connection 35 provides communication between the audio device 125 and the demonstration system controller 30. Although a single device representing, e.g., a portable wireless speaker is shown, the system is also applicable with headphones, a home theater system, and so forth. One or more wireless audio sources 20, i.e., the customer's source, is connected to the system 10 wirelessly. Examples of the wireless audio source 20 include, but are not limited to, a smart phone, a hand-held music player, a portable computer, a smart watch, and so forth. Non-portable systems could also be used, but are unlikely, as the system is intended for retail demonstration environments. In some examples, Bluetooth wireless technology is used to provide wireless communication between the audio device and the wireless audio source. The wireless audio device 15 includes a controller 22, a wireless interface 24, a set of speakers 26, and a memory 28, as described in more detail below.

Figure 2:
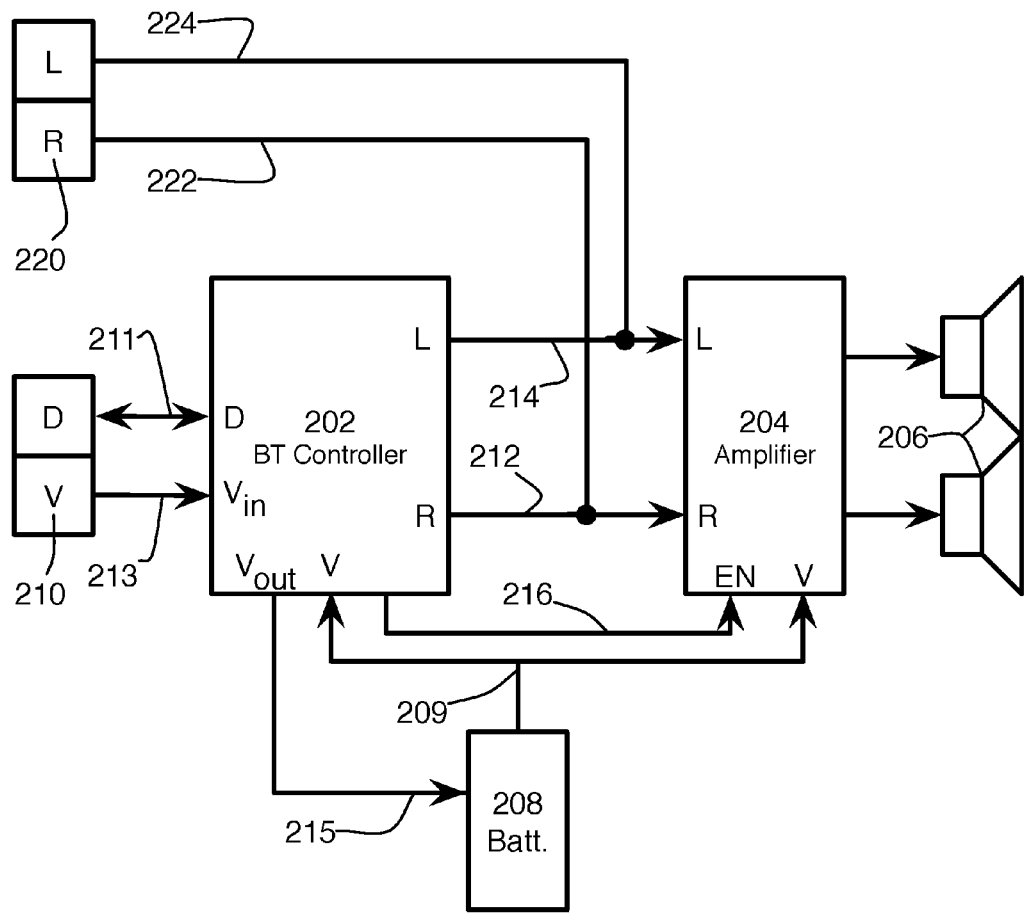
FIGS. 2 and 3 are partial circuit diagrams.

FIG. 2 shows a circuit for implementing the demonstration system of FIG. 1. A Bluetooth controller IC 202, such as a CSR8670, serves as both the Bluetooth interface circuitry and as a general microcontroller for the product, corresponding to both the controller 22 and the wireless interface 24 in FIG. 1. Additional components of the wireless interface, such as an antenna, are conventional and not shown. A headphone amplifier IC 204, such as a TI TPA6141A2, amplifies input audio signals to provide amplified output audio signals to a stereo pair of speakers 206, corresponding to the speaker set 26 in FIG. 1. A battery 208 provides power 209 to both the controller 202 and the amplifier 204, and is also charged by (or under the control of) the controller 202, line 215. A first wired interface 210, such as a USB header, provides power 211 and data 213 to the controller 202. Audio signals 212, 214 are provided from the controller 202 to the amplifier 204. A second wired interface 220 provides wired audio signals 222, 224 directly to the amplifier 204. In the example of FIG. 2, the amplifier 204 only has two input audio connections, for left and right stereo audio, and the audio signals 212, 214 from the controller are mixed with the audio signals 222, 224 from the wired connection by simply connecting them both to the inputs of the amplifier 204. In most cases, the wirelessly-received audio signals are digital, and are converted to analog signals before being output by the controller.

In other examples, an amplifier IC with more than one input may be used, with a mixing circuit internal to the amplifier IC combining the signals. In other examples, the controller IC also has an analog audio input to receive the audio signals 222 and 224, and the controller mixes those with the wirelessly-received audio signals internally before outputting the signals 212, 214. That mixing could be analog, mixing the analog wired audio input with the wirelessly-received audio after converting that to analog, or it could be digital, digitizing the analog input and mixing that with the digital input audio before converting the combined signal to analog for output.

Figure 3:
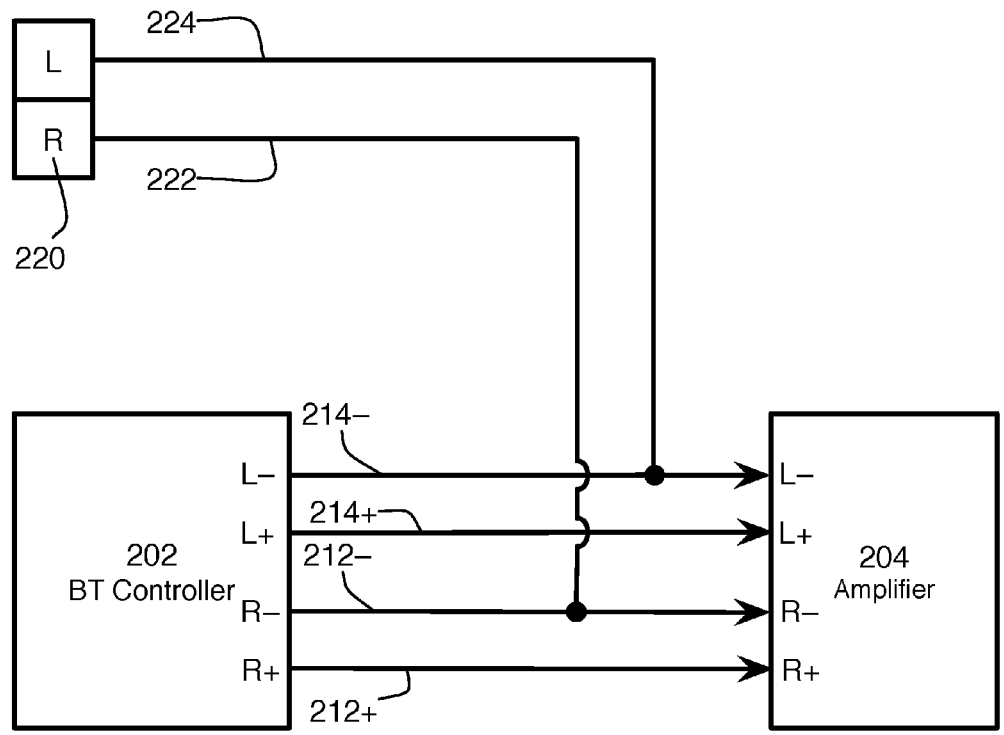
Figure 4:
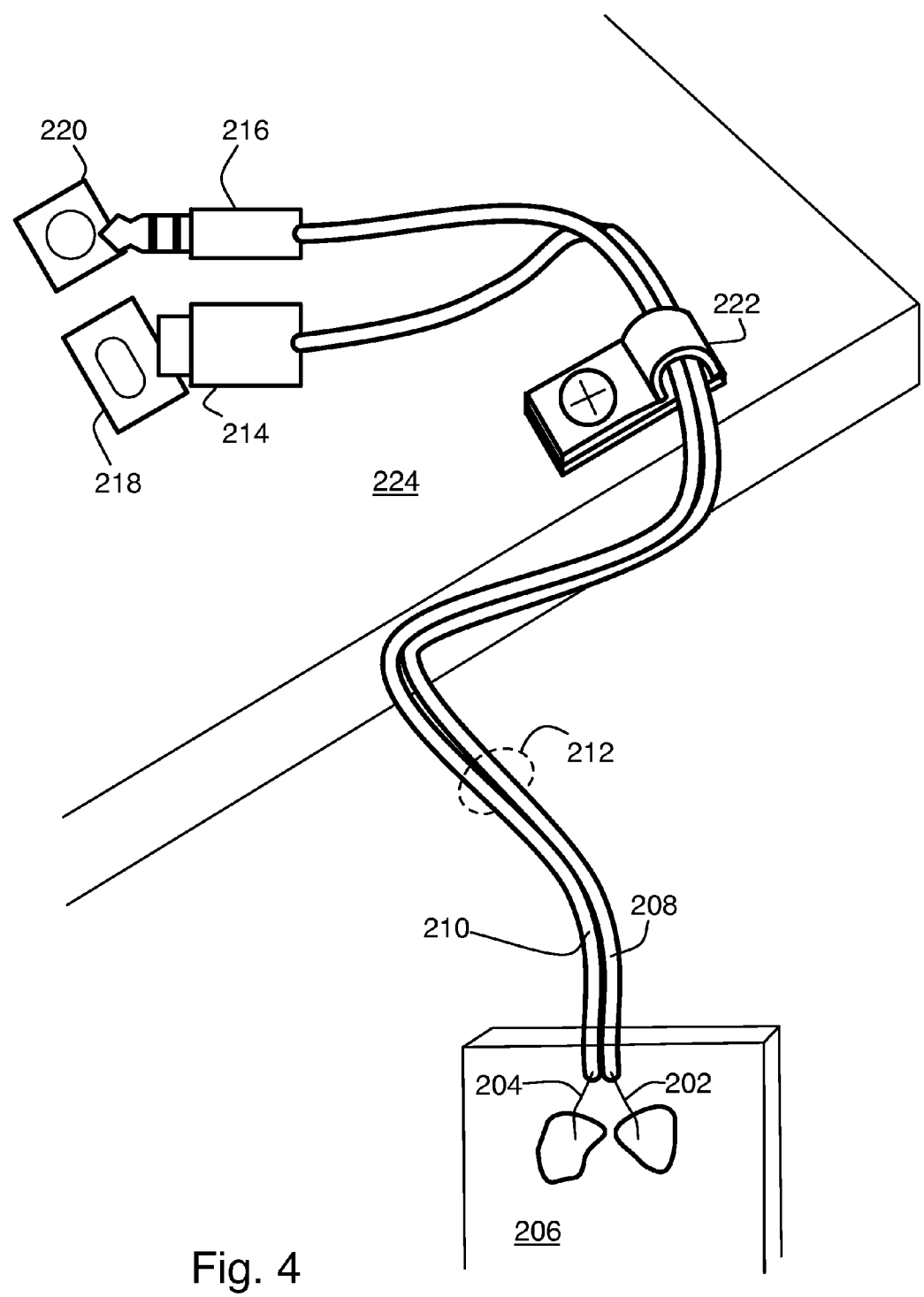
FIG. 4 shows a combined security and signal cable in the system of FIG. 1.

In some examples, as shown in FIG. 3, the audio signals output by the Bluetooth controller IC are differential, while the audio signals provided by the wired interface 220 are single-ended (i.e., L and R are both relative to a common ground). Such signals are mixed by connecting the wired audio L and R signals 222, 224 with the corresponding negative differential signals 212–, 214– at negative differential inputs of the amplifier IC, and connecting the positive differential signals 212+, 214+ directly to the positive differential inputs.

Returning to FIG. 2, a control signal 216 from the controller 202 to the amplifier 204 enables the amplifier when the microcontroller code within the controller 202 calls for audio output. In the normal version of the product, the amplifier is only enabled when the Bluetooth interface is providing audio signals. In the demonstration version, the amplifier may be enabled all the time. This avoids the controller needing to be aware of whether the demonstration is actually operating, simplifying cod for the microcontroller circuitry. The data 213 provided over the first wired interface 210 may inform the controller about the state of the demo, or provide specific instructions from the demonstration controller 30 to the device controller 202. Data can also be transmitted back from the device controller to the demonstration controller, such as to relay information about user interaction with the demonstration device, e.g., pressing buttons. While the various connections are each shown by single lines, and grounds are omitted, a person of skill in the art will appreciate that each of the connections may be differential or single-ended, may contain one or more than one signal line, and may be grounded in various ways.

In some examples, as shown in FIG. 3, the incoming conductors 202, 204 of the two wired interfaces are each soldered directly to the circuit board 206 housing the ICs, to improve the security and reliability of the product, omitting connectors that could be disconnected in the normal course of use, and assuring that stealing the product requires breaking it (thus deterring stealing it). The first wired interface 208, providing data and power, may be a conventional data cable, such as a USB cable. The second wired interface 210, providing the wired audio input, may be a conventional audio cable, such as a standard stereo cable. The pair of cables may be combined, either in a single conductor bundle or in a pair of conductor bundles in separate jackets 212, as shown. The separate jackets may be joined together, giving the appearance of a conventional stereo cable having two, separately jacketed, conductors. Additional reinforcing may be provided, such as reinforcing fibers or cables within the cable jackets, or the strength of the conductor bundles (and grounds) and jackets alone may be relied upon to provide security. The other end of the cable may have appropriate plugs 214, 216 for connecting to audio and data jacks 218, 220 in the demonstration system, or it may also be soldered at the demonstration system end (not shown). In addition to the electrical connections, the cable may be anchored to the demonstration system in a variety of ways. In one example, a P-clip 222 is used to anchor the body of the cable to a secure surface 224 of the demonstration system.

This circuit thus allows the demonstration system to maintain an audio connection to the audio device. The audio connection is mixed with audio from the paired wireless source device, allowing the customer to try out their own music while still hearing audible prompts from the demonstration system.

In addition to providing simultaneous wired and wireless audio for demonstration purposes, the circuitry of FIG. 2 also allows interactive control between the audio device 15 and the demonstration controller 30. In many wireless systems, if the wireless interface is being used to receive audio from one device, it cannot be used simultaneously to exchange control information with another device, such as the demonstration controller 30. As it is increasingly common for wireless products to use data cables, and specifically USB cables, for charging, it is also possible to add data communication to the charging cable without significant changes to the demonstration unit relative to the normal version of the product, if data communication were not already included for other reasons, such as software update. This then allows the headphones to communicate with the demonstration device and coordinate the demonstration between the two, including doing so at the same time that the wireless interface is used to receive the customer's own audio. In the example of FIG. 1, the wireless device 15 includes a user input, shown as a set of buttons 50, 51, 52. The data interface can be used to communicate to the demonstration controller 30 that these buttons have been pressed.

Figure 5:
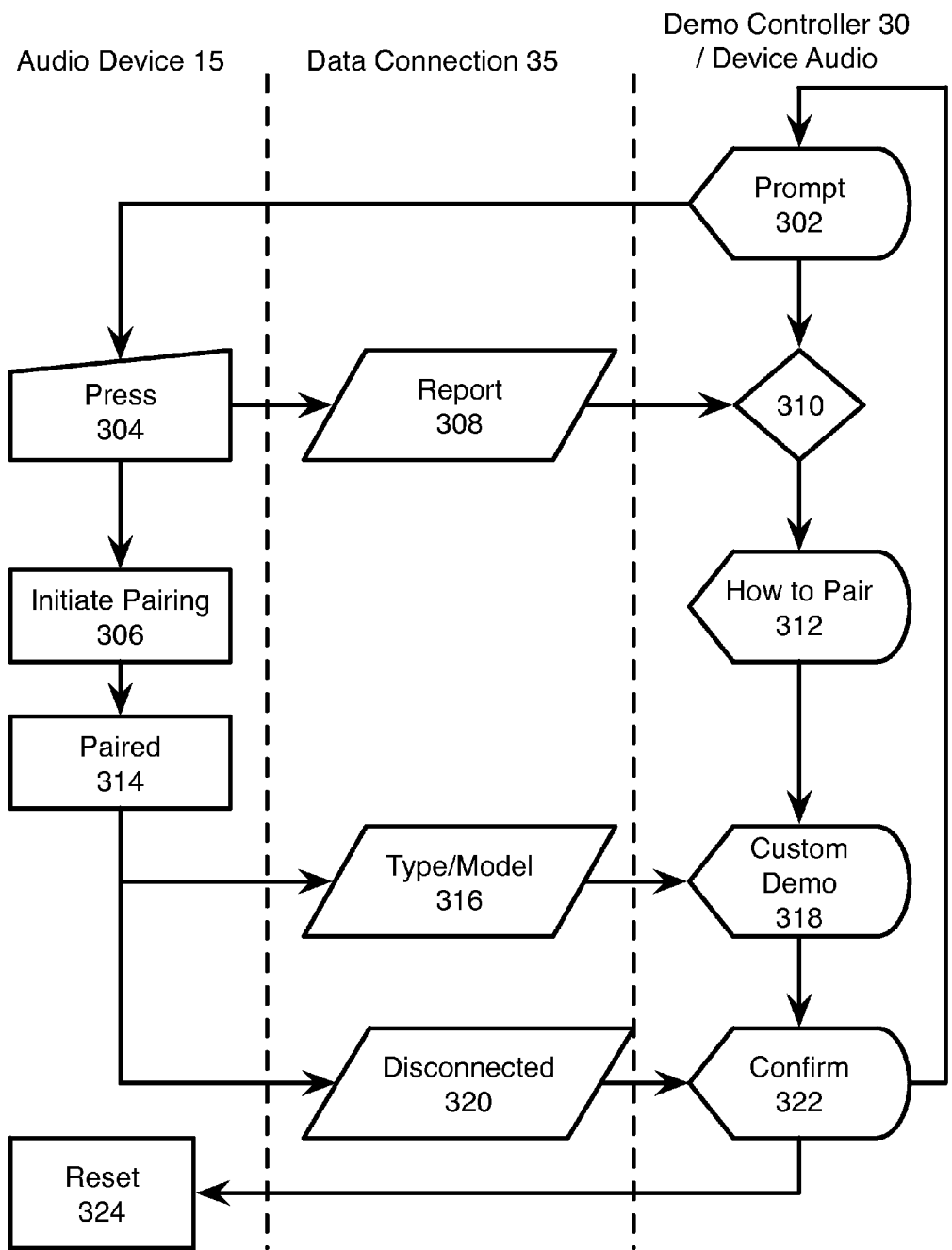
FIG. 5 is a flow diagram.

FIG. 5 shows an example demonstration process flow. In the figure, actions handled by the portable audio device's processor are shown on the left, actions handled by the demonstration controller, including audio output to the audio device through the wired connection, are shown on the right, and data communication between the two is in the middle. To guide the customer through pairing a smartphone to the audio device, the demonstration system can prompt (302) the customer to press the pairing button 50 on the audio device. The prompt can be delivered both audibly, through the wired connection 35, and visually, through the display 40. When the customer complies (304), the audio device not only initiates pairing (306), it reports (308) to the demonstration device that the customer has pressed the button. In other examples, the demonstration system may directly command the audio device to initiate pairing. After either the audio device reports that the user initiated pairing or the demonstration system did that itself, the demonstration controller knows to move on (310) to the next prompt, e.g., telling (312) the customer to now find the headset in the pairing menu of their own device. Additional interactions may also be possible, for example, once paired (314), the headphones may inform (316) the demonstration device about the type or model of the customer's device, allowing the demonstration to be tailored (318) to that device, e.g., emphasizing music playback if a music device is connected or communication capabilities of the headphones if a phone is connected. The subsequent demonstration prompts can also be made specific to the user interface of the customer's device. Another status that may be communicated between the audio device and the demonstration controller is a notification when the customer's source device has been disconnected (320), whether because the customer walked out of range or because they manually disconnected their device. In response, the demonstration system may confirm (322) that the customer (if still present) is done with the demonstration, and reset (324) the audio device, e.g., by clearing its memory of paired devices and resetting any other parameters that the customer changed.

In some examples, the audio device 15 also includes volume controls 51 and 52. In many cases, such controls influence only the level of the wireless audio played back by the device, not controlling the consumer-facing wired audio connection, as it is assumed (or enforced) that the active electronics are not used when the wired connection is in use. In the demonstration system 10, however, the data connection within the wired connection 35 can be used to communicate that the volume controls have been pressed, and demonstration controller will adjust the level of the wired demonstration audio provided to the audio device accordingly.

The memory 28 in the audio device 15 may include any suitable memory technology, such as Read Only Memory (ROM), Random Access Memory (RAM), or flash ROM, to name a few examples. Among other things, the memory stores a microcode of a program for processing and controlling the processor 16 and a variety of reference data, data generated during execution of any of the variety of programs performed by the controller 22, and various updateable data for safekeeping such as a phone book, outgoing messages, incoming messages and the like. Different types of data may be stored in different types of memory. The memory includes executable code for general operation of the wireless playback device.

The wireless module enables 24 a wireless connection using Radio Frequency (RF) communication between the audio device 15 and the wireless audio source 20. The wireless module exchanges a radio signal including data input/output through an antenna (not shown). For example, when using Bluetooth wireless technology in a transmission mode, the wireless module 24 processes data by channel coding and spreading, converts the processed data into a Radio Frequency (RF) signal and transmits the RF signal. In a reception mode, the wireless module 24 converts a received RF signal into a baseband signal, processes the baseband signal by de-spreading and channel decoding and restores the processed signal to data.

Each of the source devices, audio source 20 for example, can include a processor, a memory, and a wireless communication module implementing Bluetooth or other appropriate wireless technology (not shown). The particular construction and technology of the source devices is not within the scope of this disclosure, except to note that wireless communication module is compatible with the wireless module 24 of the audio device 15, such that it interacts with the audio device in the manner described above.

While the above describes a particular order of operations performed by certain embodiments, it should be understood that such order is exemplary, as alternative embodiments may perform the operations in a different order, combine certain operations, overlap certain operations, or the like. References in the specification to a given embodiment indicate that the embodiment described may include a particular feature, structure, or characteristic, but every embodiment may not necessarily include the particular feature, structure, or characteristic.

While given components of the system have been described separately, one of ordinary skill will appreciate that some of the functions may be combined or shared in given instructions, program sequences, code portions, and the like.

The foregoing description does not represent an exhaustive list of all possible implementations consistent with this disclosure or of all possible variations of the implementations described. A number of implementations have been described. Nevertheless, it will be understood that various modifications may be made without departing from the spirit and scope of the systems, devices, methods and techniques described here. Accordingly, other implementations are within the scope of the following claims.

What is claimed is:

1. A portable audio device comprising:
   a wireless interface for receiving first audio signals;
   a wired audio input for receiving second audio signals;
   a mixing circuit coupled to the wireless interface and the wired audio input and outputting third audio signals including audio content from both the first and second audio signals;
   a user interface;
   a data interface;
   a programmable processor in communication with the user interface and the data interface;
   an output audio transducer for receiving the third audio signals from the mixing circuit and outputting them as audible signals; and
   a security cable for discouraging theft of the portable audio device;
   wherein the security cable includes first electrical conductors providing the wired connection for receiving the second audio signals, and wherein the security cable further includes second electrical conductors providing the data interface to the programmable processor.

2. The portable audio device of claim 1 wherein the portable audio device is a set of headphones.

3. The portable audio device of claim 1 wherein the portable audio device is a portable speaker.

4. The portable audio device of claim 1, wherein the programmable processor is responsive to remote control commands received through the data interface, and communicates information about the status of the user interface through the data interface.

5. The portable audio device of claim 1, wherein the security cable includes a metal component soldered to a printed circuit board within the portable audio device, such that the security cable discourages theft of the portable audio device by assuring that removing the security cable from the portable audio device will damage the printed circuit board.

6. The portable audio device of claim 5, wherein the metal component in the security cable comprises one or more conductors of an audio cable or a data cable.

7. The portable audio device of claim 1, wherein the security cable comprises an audio cable and a data cable.

8. The portable audio device of claim 7, wherein the audio cable and the data cable are each independently jacketed, the two jackets being joined together.

9. The portable audio device of claim 1, wherein:
   the mixing circuit comprises an audio amplifier having two differential signal inputs,
   the wireless interface comprises two differential signal outputs, coupled to the differential signal inputs of the amplifier, and
   the wired audio input comprises two single-ended signal outputs, each of the two single-ended signal outputs being coupled to one side of a corresponding one of the two differential inputs of the amplifier.

10. A demonstration system comprising:
    a demonstration processor including:
      a wired audio output;
      a data interface; and
      an anchor point;
    a portable audio device comprising:
      a wireless interface for receiving first audio signals;
      a wired audio input for receiving second audio signals;

a mixing circuit coupled to the wireless interface and the wired audio input and outputting third audio signals including audio content from both the first and second audio signals;

an output audio transducer for receiving the third audio signals from the mixing circuit and outputting them as audible signals;

a user interface;

a data interface; and a programmable processor in communication with the user interface and the data interface; and a cable bundle including:

a security cable for connection between the anchor point and the portable audio device thereby preventing theft of the portable audio device;

electrical conductors connecting the wired audio output of the demonstration processor to the wired audio input of the portable audio device.

11. The demonstration system of claim 10, wherein the processor is configured to communicate information about the operation of the user interface to the demonstration processor via the data interface.

12. The demonstration system of claim 10, wherein the cable bundle further includes data conductors connecting the data interface of the demonstration processor to the data interface of the portable audio device.

13. The demonstration system of claim 10, wherein the anchor point comprises an audio jack mating with a corresponding plug on the security cable.

14. The demonstration system of claim 13, wherein the anchor point comprises a clip securing the cable to a fixed surface.

15. The demonstration system of claim 10, wherein the security cable includes a metal component soldered to a printed circuit board within the portable audio device, such that the security cable discourages theft of the portable audio device by assuring that removing the security cable from the portable audio device will damage the printed circuit board.

16. The demonstration system of claim 10, wherein:
the portable audio device user interface comprises a volume control interface,
the programmable processor of the portable audio device is configured to communicate information relating to operation of the volume control interface to the demonstration processor over the data interface.

17. The demonstration system of claim 10, wherein the programmable processor of the portable audio device is responsive to remote control commands from the demonstration processor received through the data interface, and communicates information about the status of the user interface to the demonstration processor through the data interface.

18. A method of demonstrating a portable audio device, the method comprising:
connecting a wired audio input of the portable audio device to an audio output of a demonstration device using an audio conductor integrated into a security cable;
in the demonstration device:
providing first audio signals through the audio output to the portable audio device that prompt a user to take action to connect a wireless audio source device to a wireless audio interface of the portable audio device;
in the portable audio device:
outputting the first audio signals as audible signals,
upon receiving second audio signals over the wireless audio interface, mixing the second audio signals with the first audio signals received at the wired audio input,
outputting third audio signals including audio content from both the first and second audio signals as audible signals, and
communicating to the demonstration device over a data interface that the user has connected to the wireless audio source device.

19. The method of claim 18, wherein communicating over the data interface comprises communicating through a wired data cable integrated into the security cable.

20. The method of claim 18, further comprising communicating remote control commands from the demonstration system to the portable audio device thorough the data interface.

21. The method of claim 18, further comprising receiving volume control commands through the user interface of the portable audio device, communicating the volume control commands to the demonstration system through the data interface, and adjusting the volume of the first audio signals provided from the demonstration system to the portable audio device.

* * * * *